United States Patent [19]
Robinson et al.

[11] Patent Number: 5,961,798
[45] Date of Patent: Oct. 5, 1999

[54] SYSTEM AND METHOD FOR VACUUM COATING OF ARTICLES HAVING PRECISE AND REPRODUCIBLE POSITIONING OF ARTICLES

[75] Inventors: Merrill Gene Robinson, Taylorsville; Arthur Bruce DeWald, Jr., Hickory, both of N.C.; Ronald Lee Remus, Oviedo, Fla.; Kenneth Henry Frederick, Rockledge, Fla.; Philip Anthony Napolitano; Daniel Garnett Wegerif, both of Merritt Island, Fla.; Angelo Venzon, Milipitas, Calif.

[73] Assignee: Diamond Black Technologies, Inc., Conover, N.C.

[21] Appl. No.: 08/694,100

[22] Filed: Aug. 8, 1996

Related U.S. Application Data

[63] Continuation of application No. 08/600,610, Feb. 13, 1996, abandoned.

[51] Int. Cl.[6] .................................................... C23C 14/34
[52] U.S. Cl. ............................... 204/298.25; 204/298.15; 204/298.23; 204/298.26; 204/298.27; 204/298.28; 204/298.31; 204/298.35; 118/719; 118/724; 118/729; 118/730; 134/76; 134/83
[58] Field of Search ......................... 204/298.09, 298.15, 204/298.23, 298.25, 298.26, 298.27, 298.28, 298.35, 298.31; 118/718, 719, 724, 729, 730; 134/76, 83

[56] References Cited

U.S. PATENT DOCUMENTS

| | | |
|---|---|---|
| 3,635,811 | 1/1972 | Lane ................................... 204/192.15 |
| 3,673,981 | 7/1972 | Beckham et al. ........................ 118/676 |
| 3,723,276 | 3/1973 | Lane et al. ........................... 204/192.12 |
| 3,775,285 | 11/1973 | Lane ................................... 204/298.26 |
| 3,784,458 | 1/1974 | Lane ................................... 204/192.12 |
| 3,968,018 | 7/1976 | Lane et al. ............................ 204/192.3 |
| 4,151,059 | 4/1979 | Kuehnle ............................. 204/298.27 |
| 4,548,698 | 10/1985 | Sellschopp ......................... 204/298.11 |
| 4,722,298 | 2/1988 | Rubin et al. ....................... 204/298.25 |
| 4,756,815 | 7/1988 | Turner et al. ...................... 204/298.25 |
| 4,877,505 | 10/1989 | Bergmann .......................... 204/298.41 |
| 5,024,747 | 6/1991 | Turner et al. ...................... 204/298.09 |
| 5,088,202 | 2/1992 | Boland et al. ....................... 30/346.54 |
| 5,097,800 | 3/1992 | Shaw et al. ............................ 118/730 |
| 5,281,320 | 1/1994 | Turner et al. ...................... 204/298.15 |
| 5,380,420 | 1/1995 | Tsuji .................................. 204/298.23 |

FOREIGN PATENT DOCUMENTS

| | | |
|---|---|---|
| 292 482 | 8/1991 | German Dem. Rep. . |
| 26 50 215 | 5/1978 | Germany . |
| 247 568 | 10/1989 | Japan . |

*Primary Examiner*—Nam Nguyen
*Assistant Examiner*—Rodney G. McDonald
*Attorney, Agent, or Firm*—Alston & Bird LLP

[57] ABSTRACT

A system and method are provided for vacuum coating articles that includes a means for moving the articles in semi-continuous fashion successively through a series of vacuum chambers. A carousel is transported successively through each of the vacuum chambers that rotates the articles in an epicycloidal fashion. A means is also provided for precisely and reproducibly loading and unloading the carousel with the article.

25 Claims, 13 Drawing Sheets

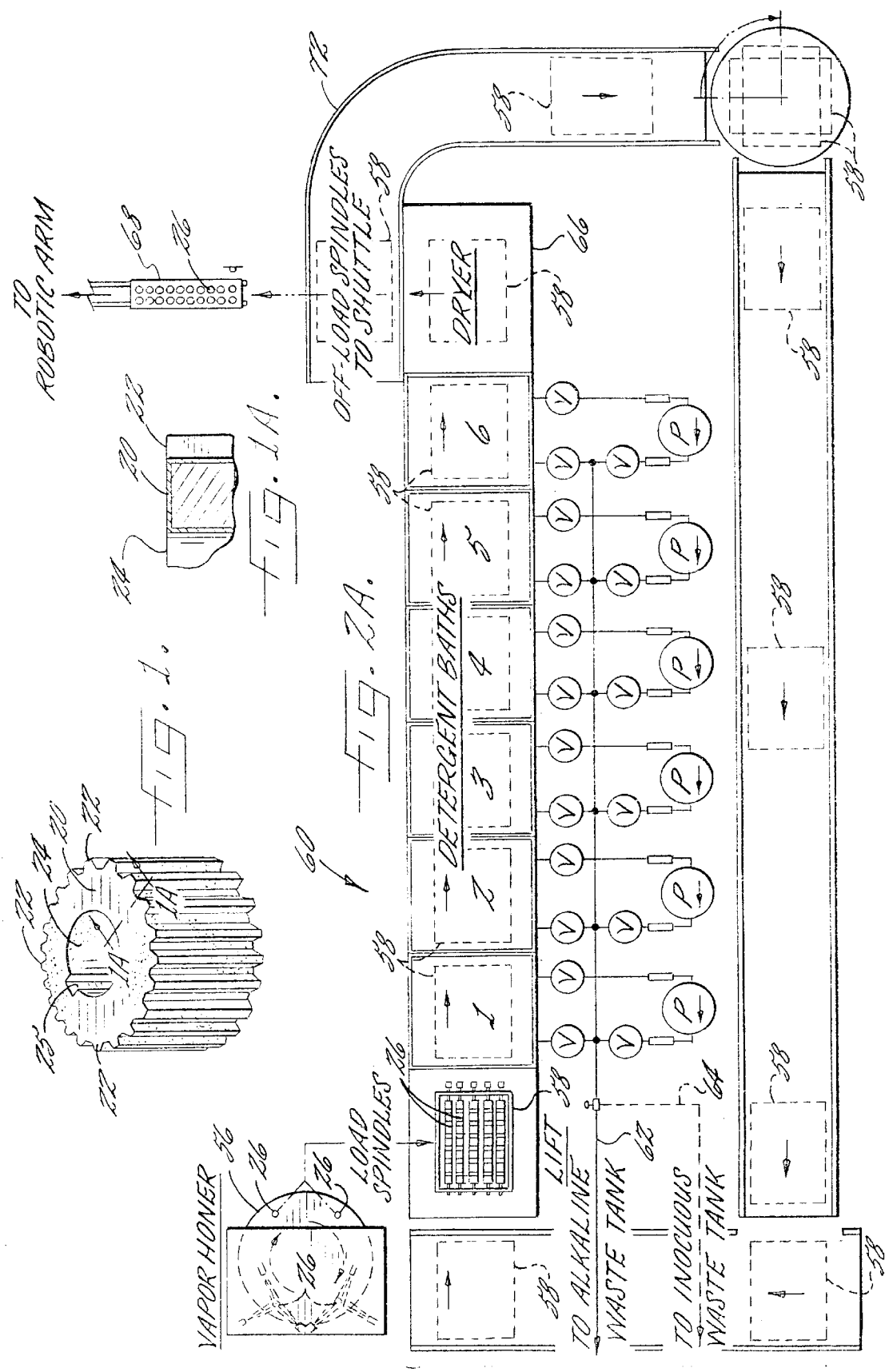

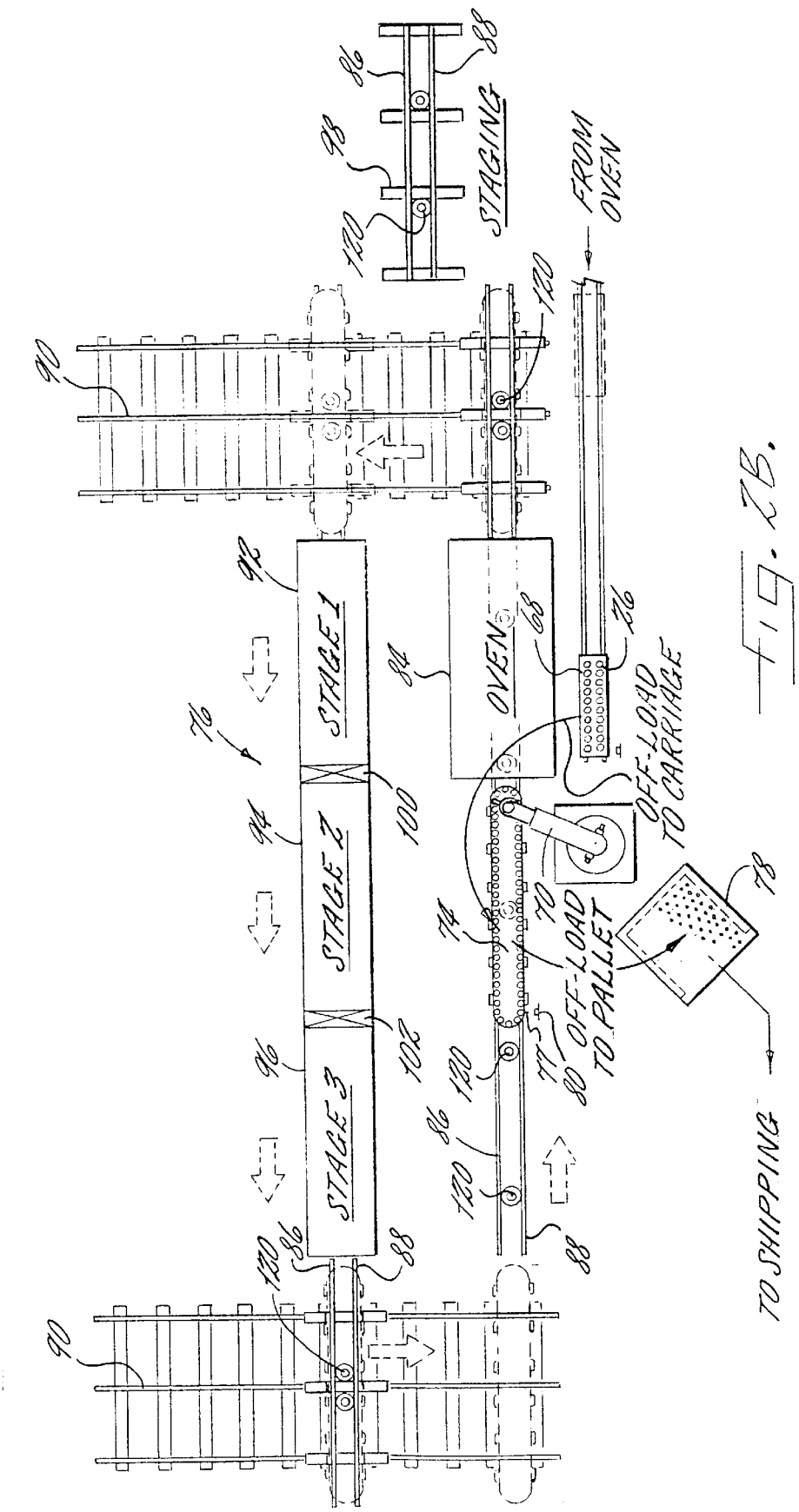

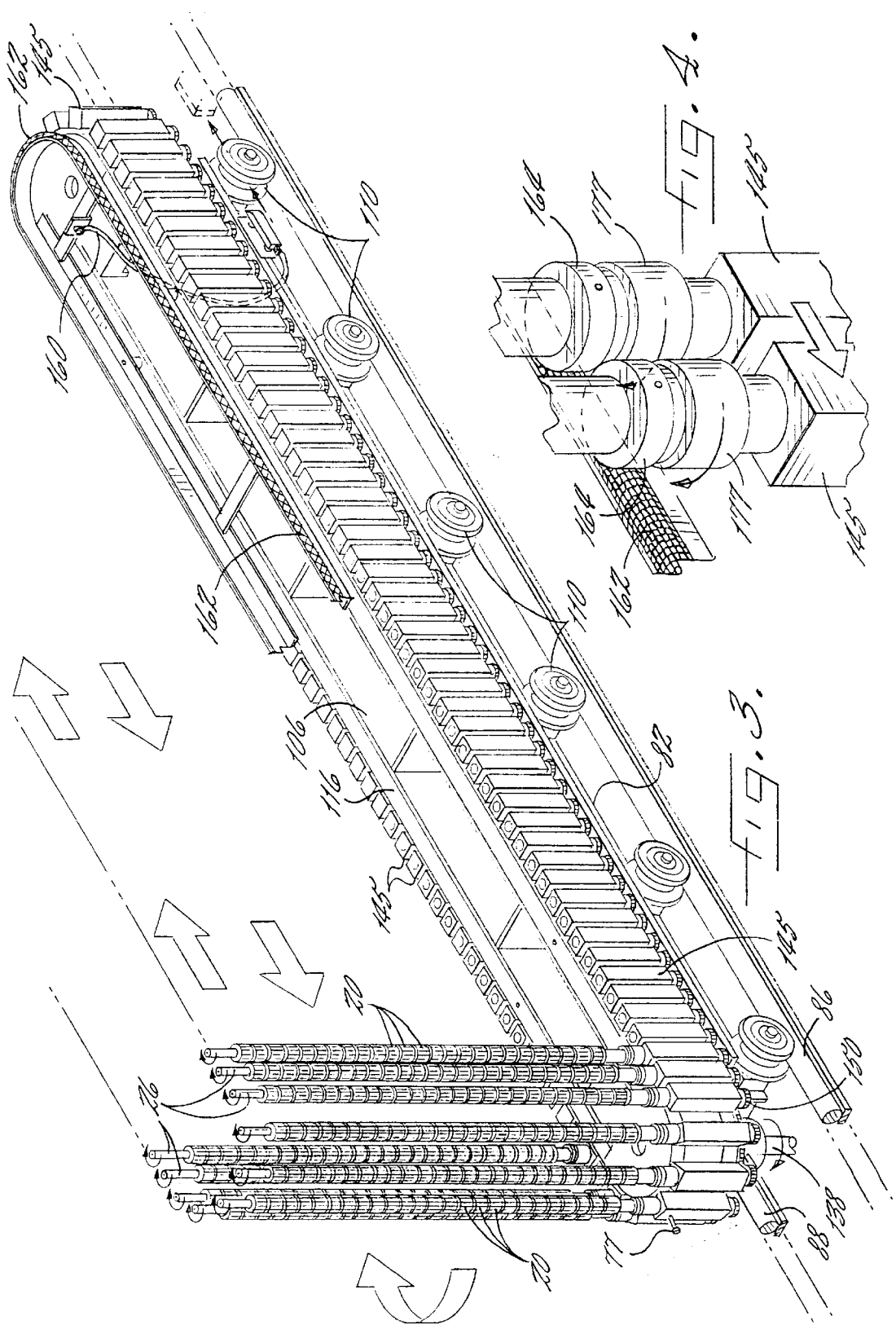

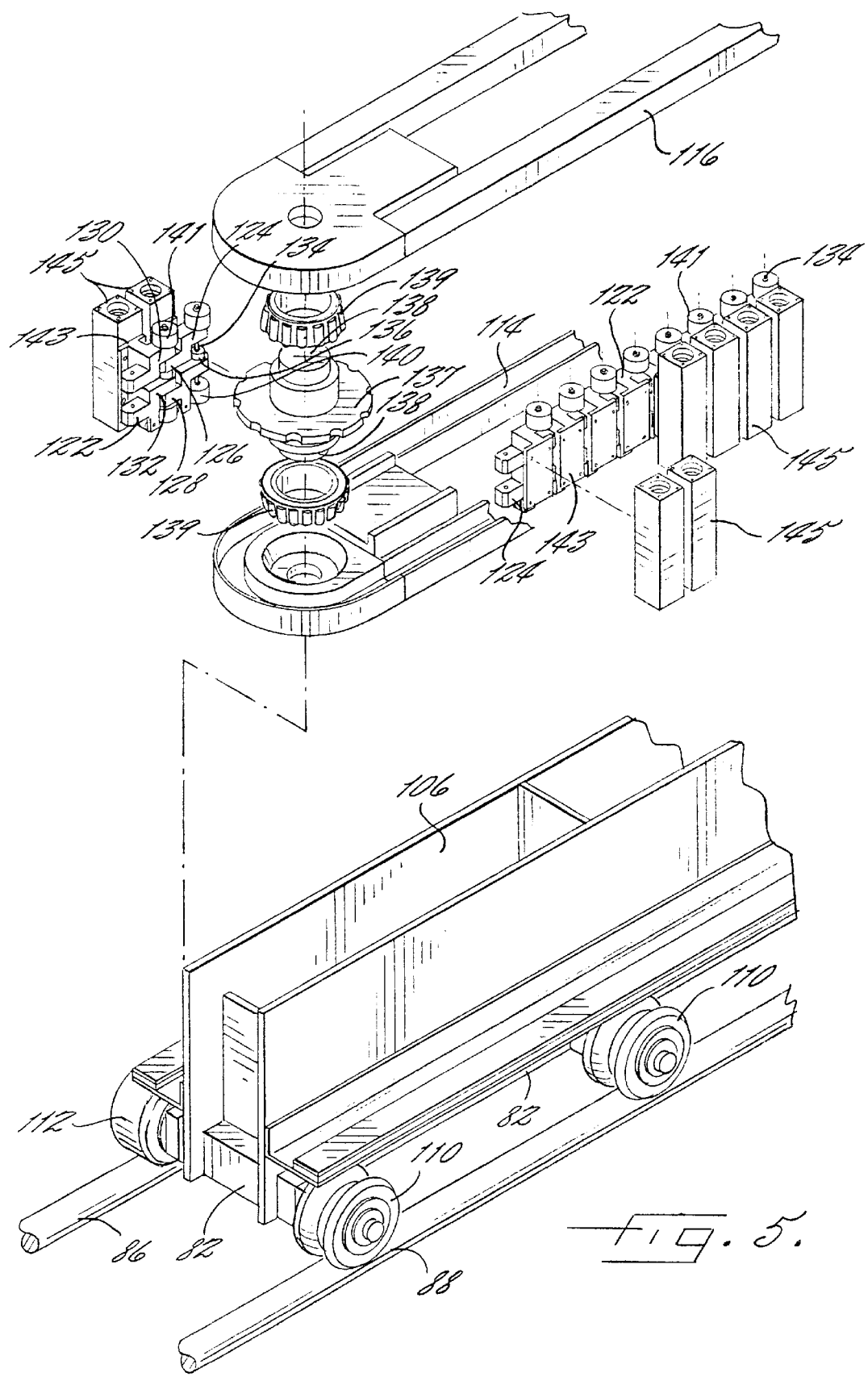

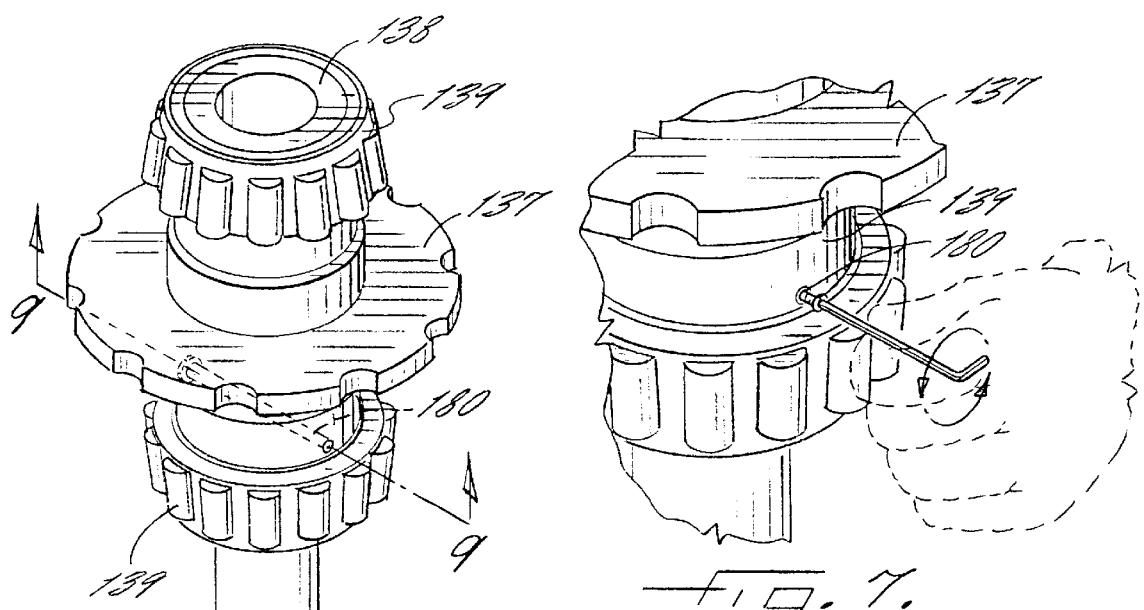
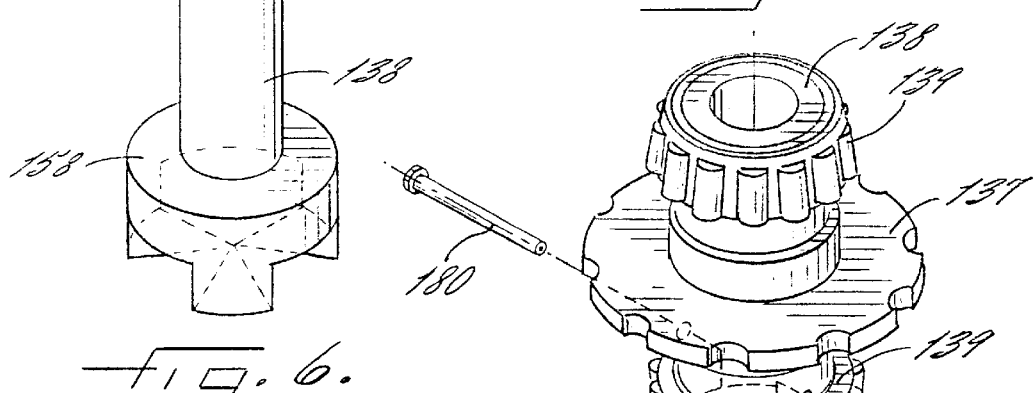
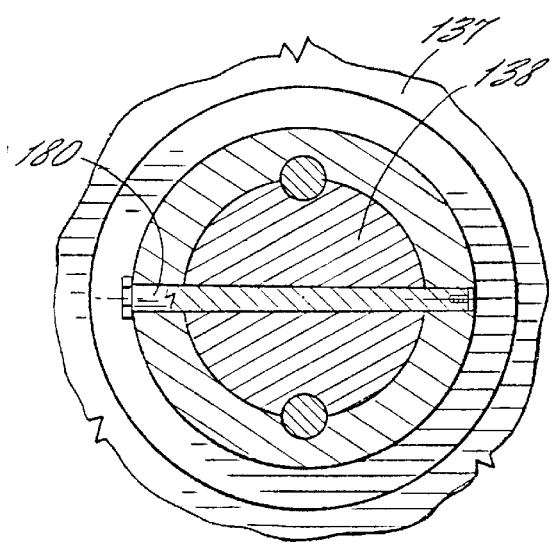
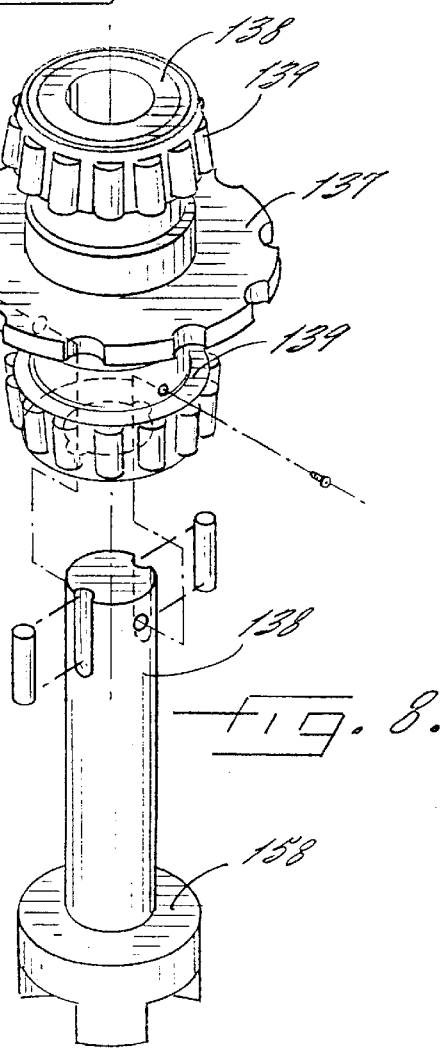
FIG. 6.
FIG. 7.
FIG. 8.
FIG. 9.

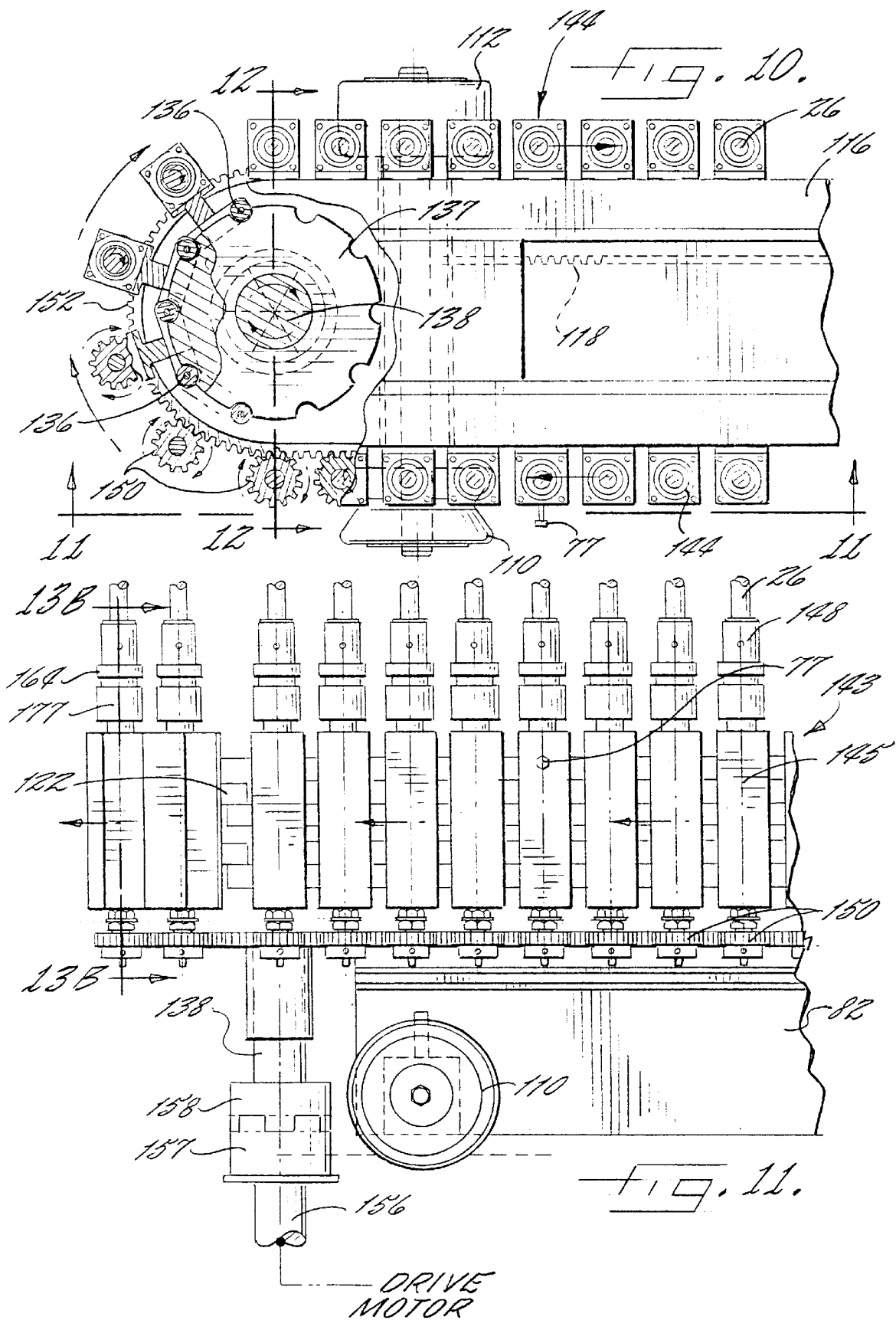

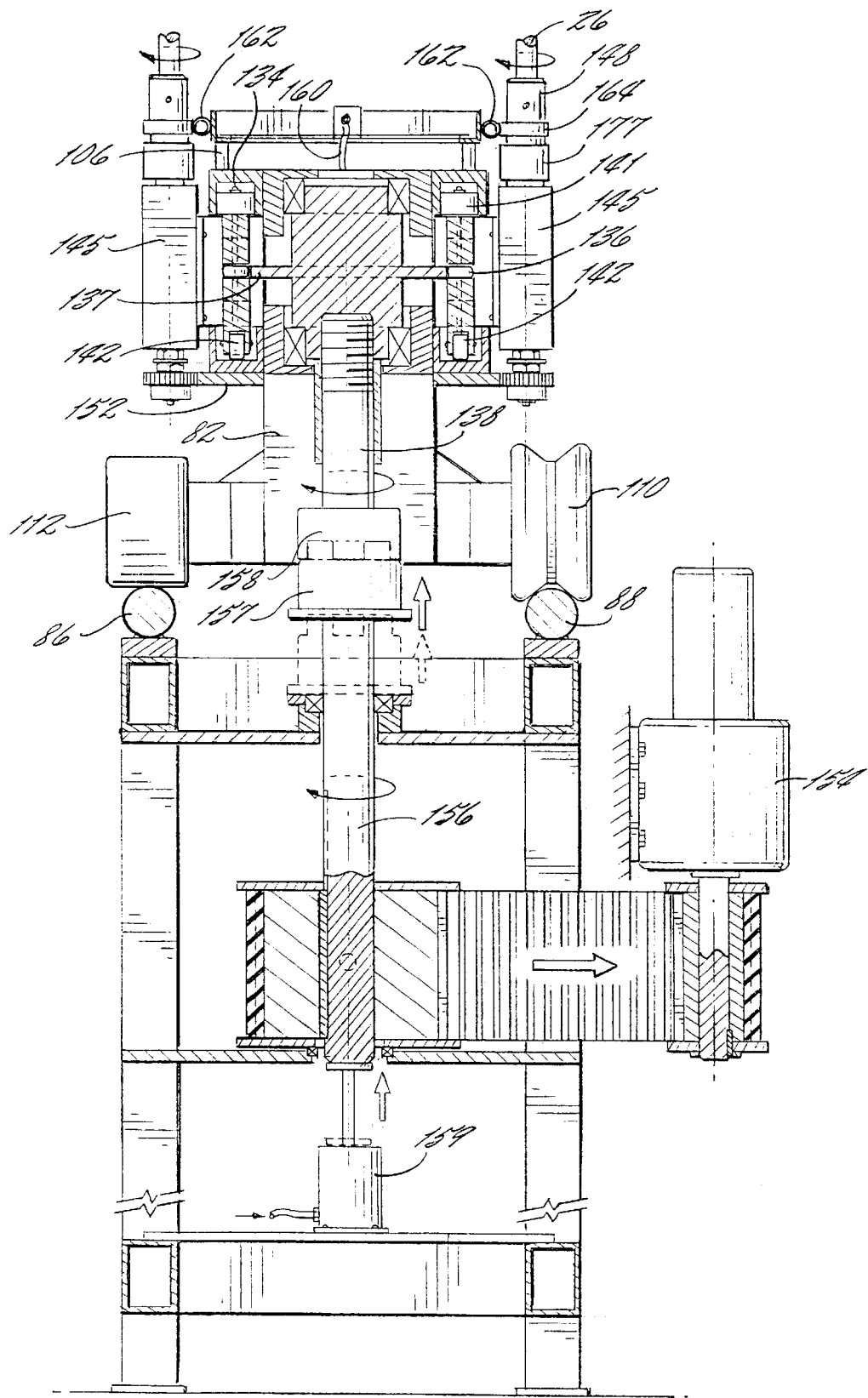

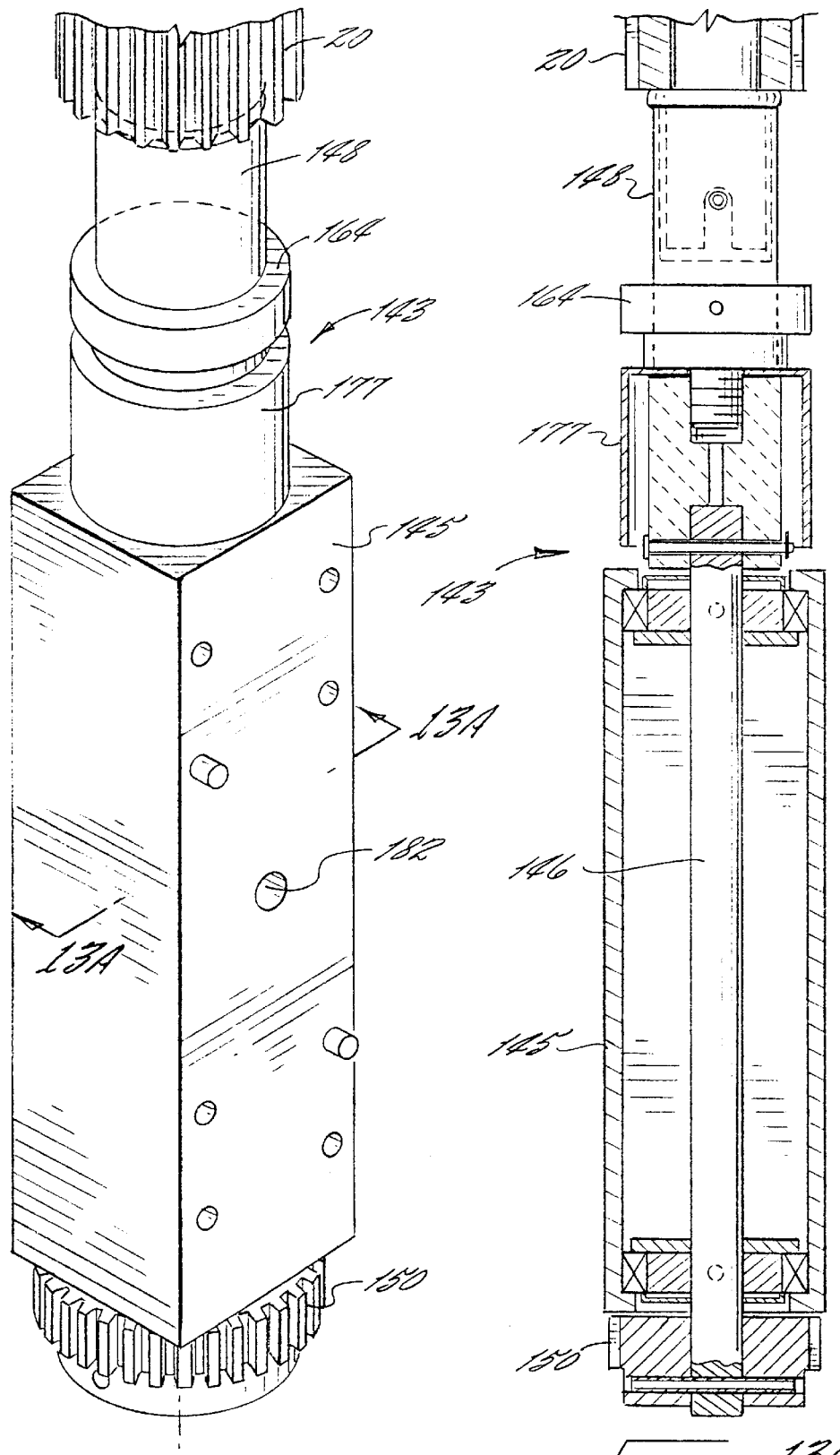

SYSTEM AND METHOD FOR VACUUM COATING OF ARTICLES HAVING PRECISE AND REPRODUCIBLE POSITIONING OF ARTICLES

This application is a continuation and claims the benefit of the filing date of U.S. Ser. No. 08/600,610, which was filed on Feb. 13, 1996 now abandoned and is entitled APPARATUS AND METHOD FOR VACUUM COATING OF ARTICLES HAVING PRECISE AND REPRODUCIBLE POSITIONING OF ARTICLES.

FIELD OF THE INVENTION

This invention relates to methods and apparatus for treating articles in a vacuum coater. More specifically, this invention relates to methods and apparatus for treatment and conveyance of articles in a vacuum coating operation.

BACKGROUND OF THE INVENTION

Sputtering is a process that uses ions of an inert gas, sometimes in the presence of a reactive gas, to dislodge atoms from the surface of a target material. The atoms then are electrically deposited to form an extremely thin coating on a glass, metal, plastic, or other surface. Sputtering has been used to deposit hard substance coatings on tools, molds, and wear parts to improve their surface characteristics and length of useful life. Some such coatings are suitable for decorative purposes. A number of coatings have been developed, one of which, boron carbide, is described in U.S. Pat. No. 4,716,083.

Sputtered coatings typically are applied in a gas plasma in a vacuum at relatively low temperatures. Reactive gases can be included in the plasma, if desired. Sputtering is a highly desirable process for applying hard substance coatings to various metal tools, wearparts, and the like because the coatings can be formed and are adherent to the substrate while avoiding significant changes in the properties of the substrate material that can be caused by elevated temperature.

As described in U.S. Pat. No. 4,716,083, it is desirable to provide an atomically clean surface on the portion of the tool or other substrate that is to be coated to facilitate formation of a uniform coating that is adherent to the substrate surface. Foreign material on the substrate surface, including outgassing from the substrate surface, can cause premature failure of the coating or a lack of adherence.

There are several methods known to the skilled artisan for providing an atomically clean surface for sputtering. In accordance with one method for providing an atomically clean substrate surface, the substrate is degreased with a chlorinated hydrocarbon degreaser. Thereafter, the substrate is rinsed in methanol and subjected to either plasma or dry chemical etching. However, organic solvents typically are not employed at the present time due to environmental considerations. Aqueous solvents are preferred.

As an example of plasma etching, after the articles to be coated have been rinsed in various solutions to prepare their surfaces, the articles may be placed in a vacuum chamber. The chamber is evacuated. An inert gas, and sometimes a reactive gas, is introduced into the chamber, and current is applied to create a plasma. The ionized atoms of gas impinge on the articles in the vacuum chamber and remove surface contaminants, such as oils or greases and adsorbed gases that may remain after the typical solvent cleaning steps. In addition, gas sputtering can be used to activate surfaces by removing oxides from metal surfaces or creating free radicals on polymeric surfaces.

After the sputter etching step is completed, then the hard substance coating is applied to the substrate. After coating is completed, the articles having the sputtered coating thereon can be removed from the chamber.

Various attempts have been made to increase the efficiency of sputter coating methods and apparatus for specific applications. For example, U.S. Pat. No. 3,968,018 describes an apparatus and a method for sequentially cleaning and coating small articles, such as treating an array of razor blades, by moving the blades successively through one chamber for cleaning, one for coating, and one for serving as a vacuum lock so that the blades can be transferred successively from one chamber to another without being contaminated during cleaning and coating.

As disclosed in U.S. Pat. No. 3,968,018, the sputtered coating atoms are deposited on the exposed edges lying along the upper surface of an array of razor blades or other articles. A series of fixtures or holders for the razor blades is generally illustrated and described.

It is important in any sputtering operation that the surfaces of the articles that are to be coated be uniformly exposed to the plasma so that a uniform coating will be formed on the exposed surfaces of the articles. However, articles having somewhat complex shapes or having a variety of shapes, as in a collection of different articles, present obstacles and difficulties to increasing the efficiency by which such articles may be sputter coated. Typically, batch operations are employed that are somewhat slow and tend to be labor intensive, reducing the number of articles that can be coated in a given period of time.

SUMMARY OF THE INVENTION

This invention is based on the recognition that a holding device for sputtering the surfaces of articles, which holding device remains stationary as it moves through successive vacuum chambers, does not provide for uniform sputter coating of articles that have somewhat complex shapes. The invention provides a means for moving articles in semi-continuous fashion successively through a series of vacuum chambers that includes a carousel for rotating the articles in an epicycloidal fashion, which carousel is transported successively through each of the vacuum chambers. A means is also provided for transporting the carousel successively through the various vacuum chambers and for precisely and reproducibly loading and unloading the carousel.

More specifically, a carousel is provided for rotating the articles in a vacuum coater. The carousel comprises a frame having an endless gear mounted thereon. An endless chainbelt is mounted for rotation about the frame and engages a means for rotating the chainbelt about the frame. A plurality of means is mounted on the chainbelt for holding the articles that are to be coated. Each article holding means includes a housing. A shaft is rotatably secured in the housing and the shaft includes a means for securing the articles. A planet gear is mounted on the shaft and engages the endless gear on the frame. The planet gear rotates externally about the endless gear in an epicycloidal fashion as the chainbelt rotates. The shaft is rotated axially by the planet gear as the shaft and housing rotate about the frame, which causes the articles that are secured by the shaft to rotate epicycloidally.

Thus, the invention provides a means whereby the surfaces of articles with somewhat complex shapes or having a variety of shapes, such as, for example, annular transmission gears, watch bands, seaming rolls for can forming, ribbed core pins for manufacturing such items as injection molded polypropylene plastic caps, or the like, can be presented to obtain a uniform coating in a sputtering atmosphere.

In a more specific embodiment, the carousel frame includes first and second, or upper and lower, chainbelt receiving tracks that are mounted on the frame in spaced apart relation and the chainbelt is mounted in the tracks for rotation about the frame. The chainbelt is made of a plurality of linkage segments. Each linkage segment has a pair of parallel linkage bars that are offset from the linkage bars of the adjacent segment. The linkage segments are interconnected by linkage pins that extend through apertures in the aligned linkage bars. A support bearing is mounted on the linkage pin between the pairs of linkage bars for engaging a chainwheel for rotation of the chainbelt. A pair of rollers is mounted on the opposite ends of each of the linkage pins for engaging the upper and lower chainbelt receiving tracks. A mounting plate is an integral part of each pair of linkage bars for mounting an article holding means externally to the chainbelt.

The carousel is used in a system for vacuum coating articles that has first, second, and third vacuum chambers located in series and separated by valves wherein the first chamber is for cleaning the articles, and the second is for coating the articles, and the third is for removing the articles from vacuum without contaminating the second chamber. Separate means are provided for evacuating and pressurizing each of the three chambers. Means are provided for transporting the carousel successively through the chambers.

The carousel can be mounted on a wheeled carriage for transport through the coating chambers and for transport to and from means for loading and unloading the articles onto the carousel. For example, gears can be placed on spindles that fit into a recess on the rotatable shaft that is secured in the housing of the article holding means. Robotic means are provided for precise and reproducible positioning for loading the spindles onto the carousel and for unloading spindles that have coated gears onto a pallet. The method of the invention, including operation of the system and of the carousel, can be automated if desired to approach a semi-continuous coating operation that can provide for uniform coating of a relatively large quantity of articles having somewhat complex or variable shapes.

BRIEF DESCRIPTION OF THE DRAWINGS

Some of the features and advantages of the invention have been stated. Other advantages will become apparent as the description of the invention proceeds, taking into conjunction the accompanying drawings, in which:

FIG. 1 illustrates a perspective view of an annular gear that can be vacuum coated in connection with the invention;

FIG. 1A illustrates a section through a portion of the annular gear of FIG. 1 taken along line 1A—1A thereof;

FIG. 2A illustrates a subsystem of the present invention for vapor honing, solvent cleaning, and drying of articles prior to entry into a vacuum system;

FIG. 2B illustrates, in highly schematic fashion, a vacuum coating subsystem of the invention, illustrating loading and unloading of articles;

FIG. 3 illustrates a partially broken away perspective view of a carousel of the invention mounted on a carriage having wheels for transport on rails through a vacuum system;

FIG. 4 illustrates a portion of an article holding means from the carousel of FIG. 3 for applying a bias voltage to the articles for coating and for insulating a portion of the article holding means;

FIG. 5 illustrates an exploded perspective view of a portion of the carousel of FIG. 3 showing the frame and the mounting and drive arrangement for the chainbelt;

FIG. 6 illustrates a perspective view of a portion of the drive arrangement of FIG. 5 for the chainwheel that drives the chainbelt;

FIG. 7 illustrates a fragmentary view of the perspective of FIG. 6 showing how the chainwheel is easily installed and removed;

FIG. 8 illustrates an exploded perspective view of the drive arrangement of FIG. 6;

FIG. 9 illustrates a transverse section through the drive arrangement of FIG. 6 taken along line 9—9;

FIG. 10 illustrates a top plan view of a portion of the carousel of FIG. 3 showing travel of the article holding means about the carousel and, in a partially broken away portion, epicycloidal rotation of the planet gears about the endless gear and engagement of the chainbelt by the chainwheel;

FIG. 11 illustrates a side view of the carousel of FIG. 10 taken along line 11—11 of FIG. 10;

FIG. 12 illustrates a transverse section through a portion of the carousel of FIG. 10 taken along line 12—12 of FIG. 10 and illustrates the drive mechanism for the chainwheel;

FIG. 13 illustrates a perspective view of an article holding means;

FIG. 13A illustrates a longitudinal section through a portion of an article holding means taken along line 13A—13A of FIG. 13;

DETAILED DESCRIPTION OF THE PREFERRED EMBODIMENT

The invention will now be described more fully with reference to the accompanying drawings, which illustrate a preferred embodiment of the invention.

Illustrated in FIG. 1 is a perspective view of an annular gear 20, such as a transmission gear, having a plurality of teeth 22 evenly spaced about the circumference of the gear and having a centrally located annular space 24 with a keyway 25 for locating the gear on a gear shaft. FIG. 1A illustrates a section through a portion of the gear taken along line 1A—1A of FIG. 1.

Figures 13B, 14:
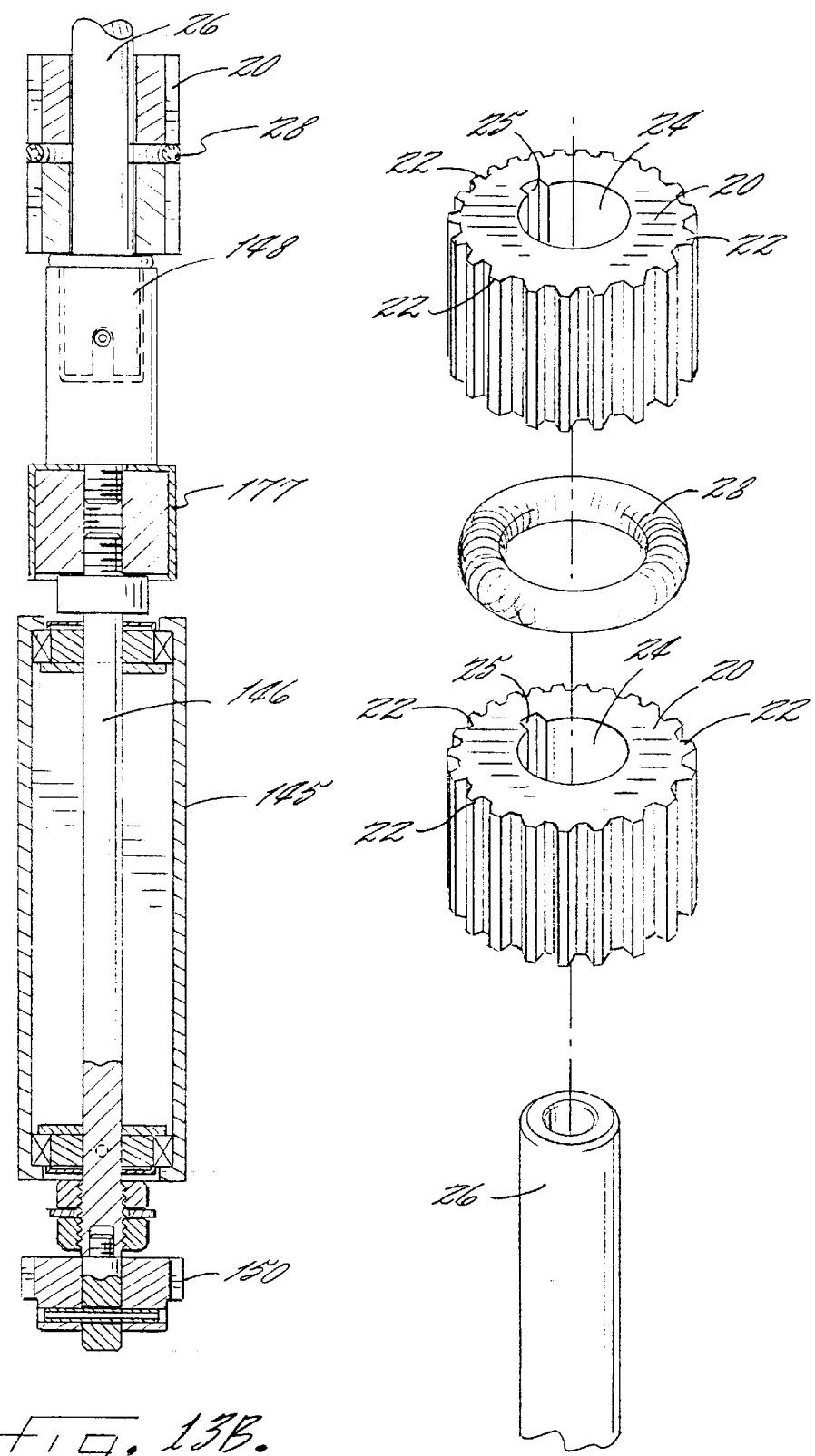
FIG. 13B illustrates a longitudinal section through an alternative embodiment of an article holding means.
FIG. 14 illustrates an exploded view of an arrangement for mounting individual annular gears on a spindle as shown in FIG. 3.

Multiple annular gears 20 are arranged on spindles 26 as shown in FIGS. 3 and 14 for treatment in accordance with the invention. The spindle is of a size to fit within the centrally located annular space 24 in the gear so that the gear will rotate when the spindle is rotated and will be transported with the spindle. Also, it is desirable to separate the gears by an annular spring 27 or the like so that the surfaces of these discrete gears do not contact each other when loaded on the spindles. The annular spring or like separating means provides for a continuous electrical bias contact between each gear and the spindle.

The apparatus and method are described below and illustrated primarily with respect to the annular transmission gear illustrated in FIGS. 1, 3, and 14. However, it should be recognized that the annular gear 20 is but one of several different items that could be usefully coated by practice of the invention. The invention can be practiced with a wide variety of articles, many of which have somewhat complex shapes for coating and some of which, though by no means all, are also illustrated in FIGS. 1B through 1E and 14A through 14D.

Figure 1B:
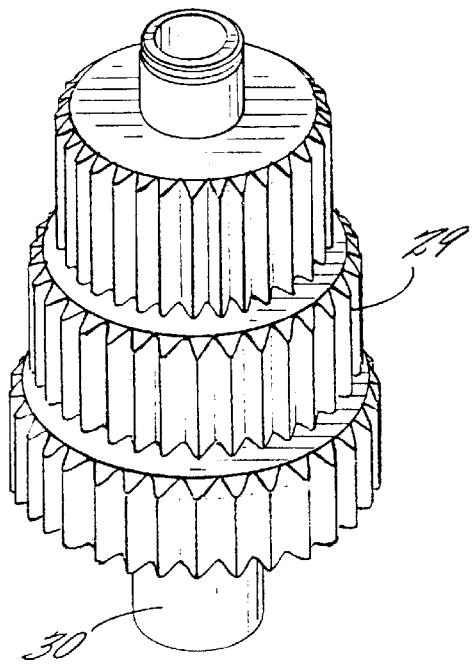
FIG. 1B through 1E illustrate perspective views of examples of various additional articles that can be vacuum coated in connection with the present invention.
Figure 14A:
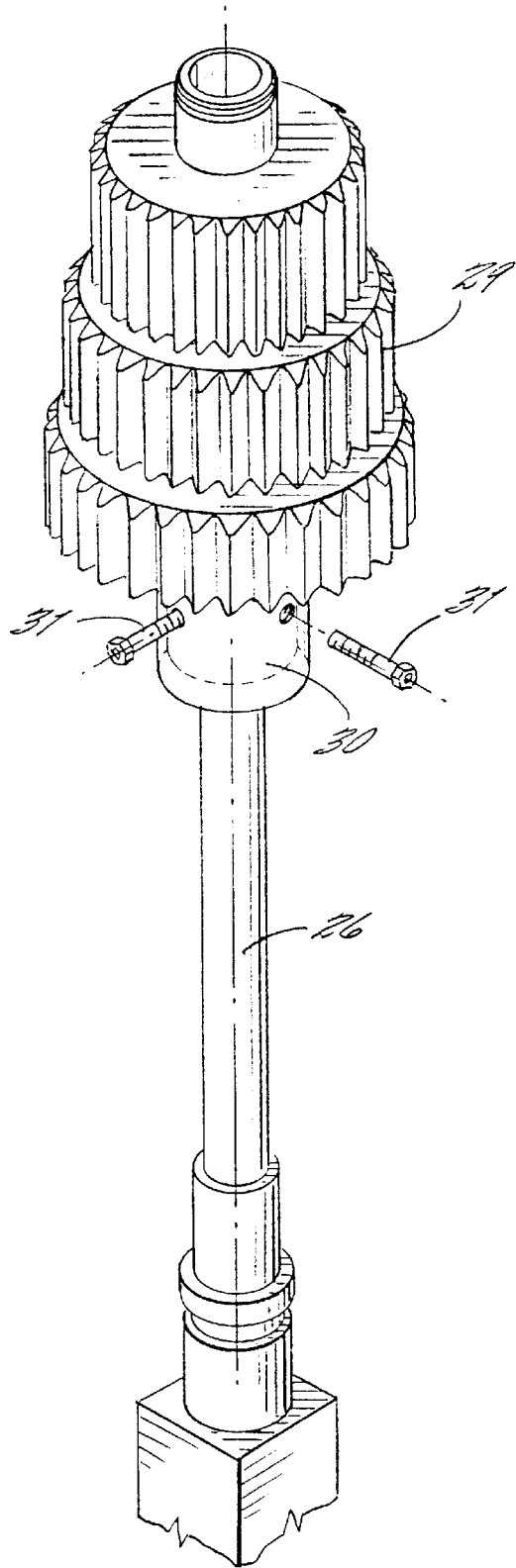
FIG. 14A illustrates a perspective view of an arrangement for mounting a graduated truck transmission gear on a spindle.

FIG. 1B illustrates a graduated series of truck transmission gears 29 welded on a countershaft 30. The countershaft is secured to a spindle 26 as shown in FIG. 14A by threaded pins 31 so that the countershaft will rotate as the spindle is rotated.

Figure 1C:
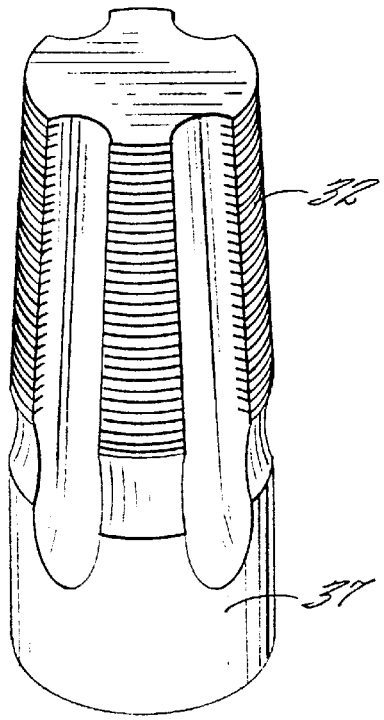
Figure 14B:
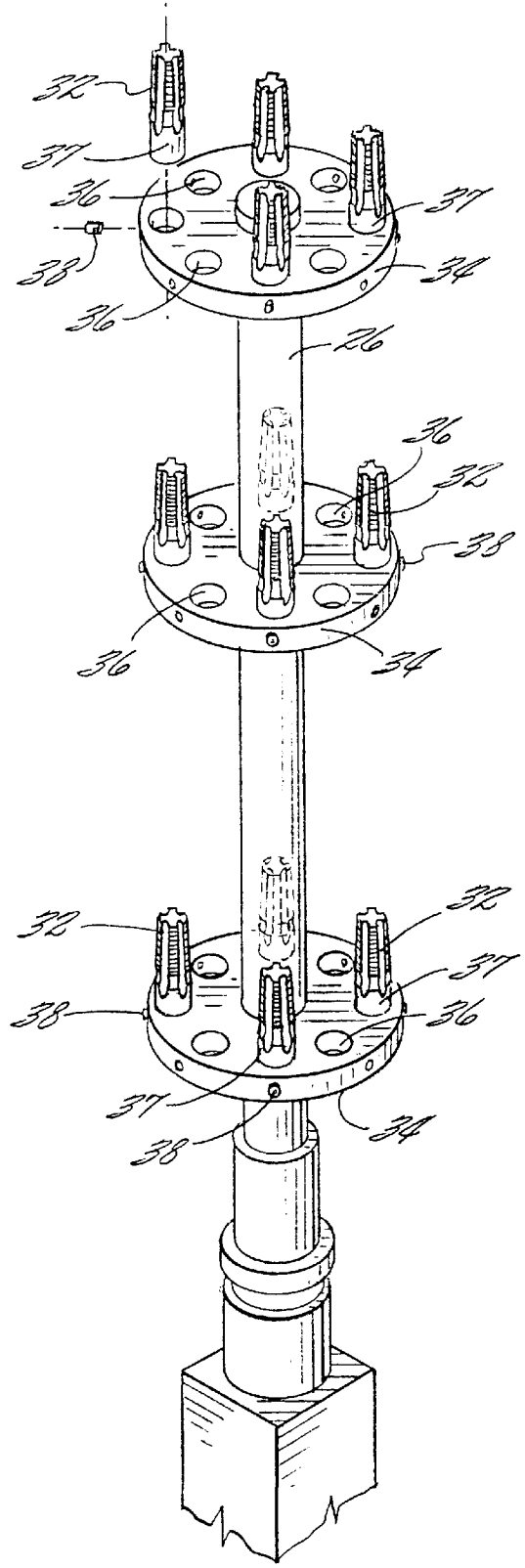
FIG. 14B illustrates a perspective view of an arrangement for mounting threaded members on a spindle.

FIG. 1C illustrates a tap 32 for cutting an internal screw thread in a pipe or the like. Multiple ones of these taps are illustrated in FIG. 14B mounted on a spindle 26 for coating in the method and apparatus of the invention. The spindle has a series of disks, or wheel fixtures, 34 mounted thereon with circumferentially spaced apart apertures 36 for receipt of the bases 37 of the taps. Threaded pins 38 secure the taps in place for rotation with the spindle.

Figure 1D:
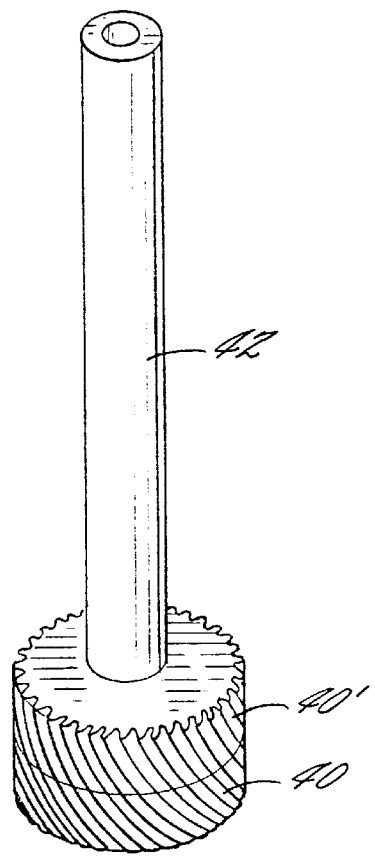
Figure 14C:
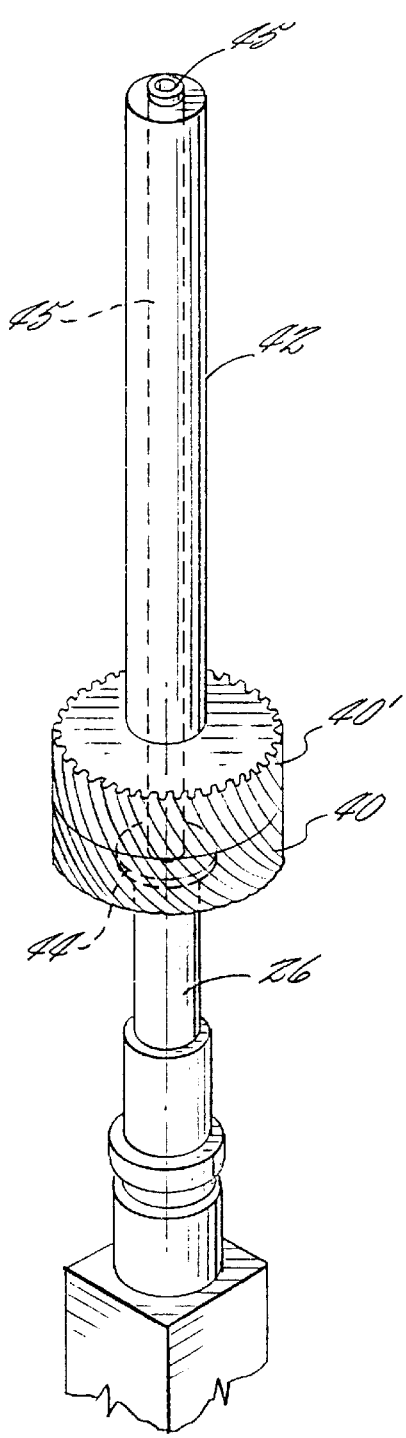
FIG. 14C illustrates a perspective view of an arrangement for mounting a gear and shaft combination on a spindle.

FIG. 1D illustrates a pair of gears 40, 40' mounted on a shaft 42 that is shown in FIG. 14C fixed to a spindle for rotation with the spindle. Typically, a plurality of these gears is mounted on the shaft. The gears rest on a cylindrical disk support 44 illustrated in shadow mounted over the spindle and having a central rod 45 supporting the shaft.

Figure 1E:
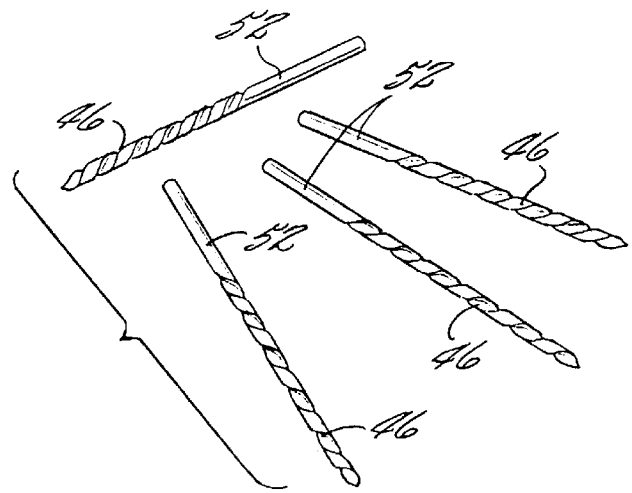
Figure 14D:
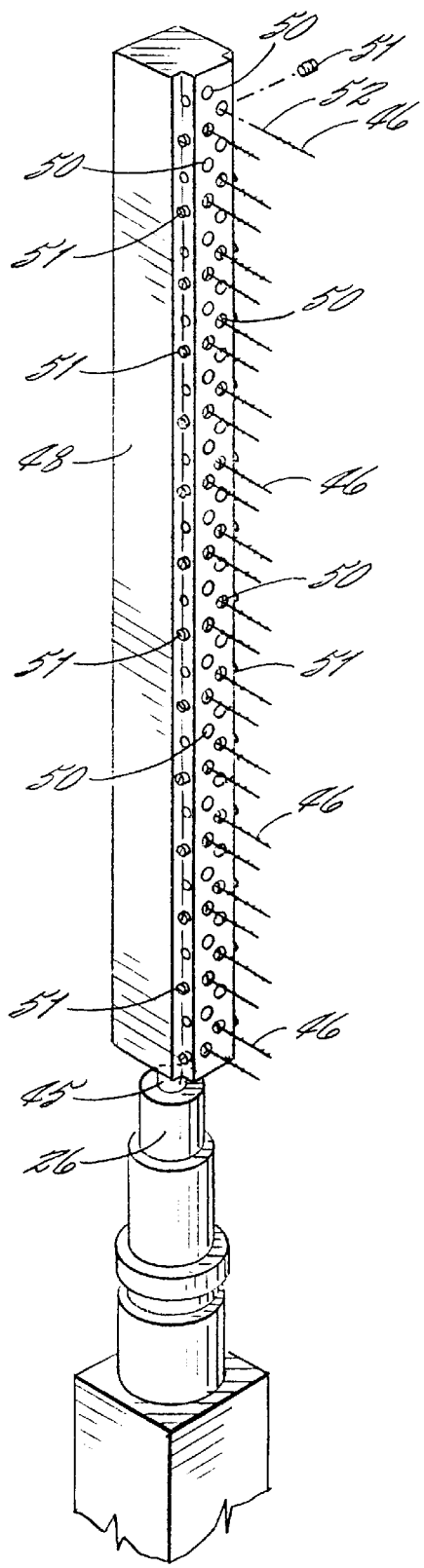
FIG. 14D illustrates a perspective view of an arrangement for mounting drill bits on a spindle.

FIG. 1E illustrates a number of drill bits 46 that are shown mounted for transport and rotation in FIG. 14D. In this arrangement, a mounting block, or channel fixture, 48 is fixed to the spindle and supported by a rod that contains multiple apertures 50 for receipt of the bases of the drill bits. Threaded pins 51 engage the bases 52 of the bits to secure them in the apertures for transport and rotation with the spindles.

In each of FIGS. 14 and 14A through 14D, the channel fixtures, threaded pins, wheel fixtures, annular springs, or other mounting devices provide for continuous electrical bias contact between each item to be coated and the spindle on which the mounting device is mounted.

It should be readily apparent that a wide variety of articles having complex shapes or varying in shape one from another can be mounted on the spindles for transport through the apparatus of the invention and for rotation with the spindles. Additional examples include core pins for plastic mold injection forming of polypropylene screw caps for bottles, which have been successfully coated by practice of the invention. Broaches having cutting edges for forming jet engine turbine components have been successfully coated. The broaches can be mounted to the spindle in channel fixtures where the base of the broach is held in placed by threaded pins, the pins and channel fixture providing continuous electrical bias contact between the broach and the spindle. Virtually, the entire surface of the broach can be coated in this manner.

It is desirable to coat gears and other articles with a hard substance coating, such as the boron carbide coating described in U.S. Pat. No. 4,716,083, to improve the wear characteristics and useful life of the article. Improvements in wear characteristics and useful life of transmission components may enable automobile and truck manufacturers to extend warranties and to otherwise reduce transmission maintenance and repair costs.

Turning now to a discussion of the treatment of the gears of FIG. 1 in the method and apparatus of the invention, when the gears are received by the vacuum coater, multiple gears may be loaded onto a spindle 26 as shown in FIG. 14 and in FIG. 3 for honing, solvent treatment, sputter etching, and sputtering of boron carbide coating thereon. As illustrated in FIG. 2A the spindles, with the gears loaded thereon, are placed upright in a vapor honing device 56 for removing oxidation that may have formed on the surface of the gear. The vapor honer that is illustrated uses an aqueous diatomaceous earth solution to blast the gear at a pressure of from 60 to 90 psi. A vapor honer of the type illustrated is the Vaqua Processing Unit available from Abrasive Developments, Ltd. in England.

After vapor honing, the spindles are removed from the vapor honer and are loaded into an array that is provided by a chassis 58 for holding multiple spindles. The chassis loaded with spindles then passes through a solvent bath treatment for further cleaning prior to sputter etching.

Any suitable solvent cleaning treatment can be used. An organic solvent treatment is described in U.S. Pat. No. 4,716,083, in which the substrate is degreased with a chlorinated hydrocarbon degreaser, rinsed in methanol, and then subjected to plasma or dry chemical etching. Typically, aqueous baths are desirable from an environmental standpoint. In the embodiment illustrated, the substrate, which in this case is gears, passes through a series of aqueous baths 1 through 6 based on deionized water and shown generally at 60.

The gears pass through an alkaline bath 1, a DI water rinse bath 2, a rust stripper 3, two additional rinse baths 4 and 5, and a rust inhibitor bath 6. Pumps are provided for vigorous circulation of the liquid within each bath. A lift with an overhead crane is provided for transporting the array of spindles from bath to bath. The lift provides for rotating the array while it is removed from the bath to shake off the contents of the bath to minimize contaminating the next bath in the sequence.

As should be apparent to those of skill in the art, the circulation of the various baths, the residence time in each bath, and other parameters for the solvent cleaning step can be determined empirically and can be controlled automatically. Additionally, the aqueous solutions are monitored to maintain their composition within predetermined limits to insure effective treatment of the substrate. Lines 62 and 64 are provided for conveying waste from the system to waste tanks for holding for treatment.

After the rust inhibitor has been applied in bath 6, then the array is loaded into a hot air drying unit 66 and dried to remove moisture and reduce the possibility of contaminating oxidation forming on the gears prior to sputter coating. Once the gears are dried, then the array is removed from the dryer and an operator removes the spindles from the chassis and places the spindles upright in a shuttle 68. The operator then initiates transport of the shuttle 68 to a robotic arm 70 (FIG. 2B). A track 72 is provided for returning the chassis in which the spindles have been held for transport through the solvent baths and dryer to the vapor honer where the chassis can be reloaded with spindles.

As illustrated in FIG. 2B, the shuttle, loaded with spindles and having gears thereon, is conveyed from the hot air dryer to the robotic arm. The robotic arm is extendable over a wide radius and can be programmed to position itself for removal of each spindle from the shuttle and to place the spindles with the gears loaded thereon at various predetermined locations about the periphery of a carousel 74 for conveying the spindles through a three stage sputter coating unit shown generally at 76. The robotic arm carries a plastic cone on its head that fits into the top of each spindle for proper alignment.

It should be noted, as illustrated in FIG. 2B, that the robotic arm can be operated both to place untreated gears and spindles from the shuttle into the carousel and to remove coated gears and spindles from the carousel. When the carousel is in position at a location adjacent the robotic arm for removal of coated gears, as shown at 74 then the robotic arm, using a locating stud 77 such as is illustrated in FIG. 3 for determining a reference point with respect to the spindles, lifts a coated spindle and gear combination from the carousel and transfers it to a pallet 78 for removal from the system and for shipping to the customer. A proximity switch 80 is shown in FIG. 2B which locates the stud. The carousel can be rotated so that the spindles progress about the carousel in a manner to be described below. After having unloaded a treated spindle from the carousel, then the robotic arm swings around and picks an untreated spindle from the shuttle 68. This untreated spindle is then placed in proper position on the carousel. The ability to robotically precisely and reproducibly position the spindles in the carousel and on the pallet helps provide for automation of the system and semi-continuous operation.

Once the carousel has been fully loaded, then the carousel, which is mounted upon a wheeled carriage 82 as shown in FIG. 3, is transported to an oven 84 to primarily minimize the absorption of moisture and secondarily to raise the carousel, spindle, and gear temperatures to a value in accord with the stage 1 processing temperature. A suitable oven of the type illustrated in FIG. 2B is available from Bowden Industries, Inc. of Huntsville, Ala. The carriage travels along a pair of tracks 86, 88, which are comprised of circular bars as shown in FIGS. 2B and 3. The transport of the carousel is described further hereinbelow with respect to FIGS. 3 and 5 through 12.

The carousel is transported along the parallel tracks to exit the oven and is then moved, along with the track portion on which it rests, transversely to its longitudinal axis by means of a rack and pinion drive 90 to a position where the carousel is ready to enter stage 1, which is vacuum chamber 92, of the vacuum chambers 92, 94, and 96. A staging area 98 is shown so that, if necessary, the carousel can be removed from the track and operation of the system may proceed with another carousel.

Figure 15:
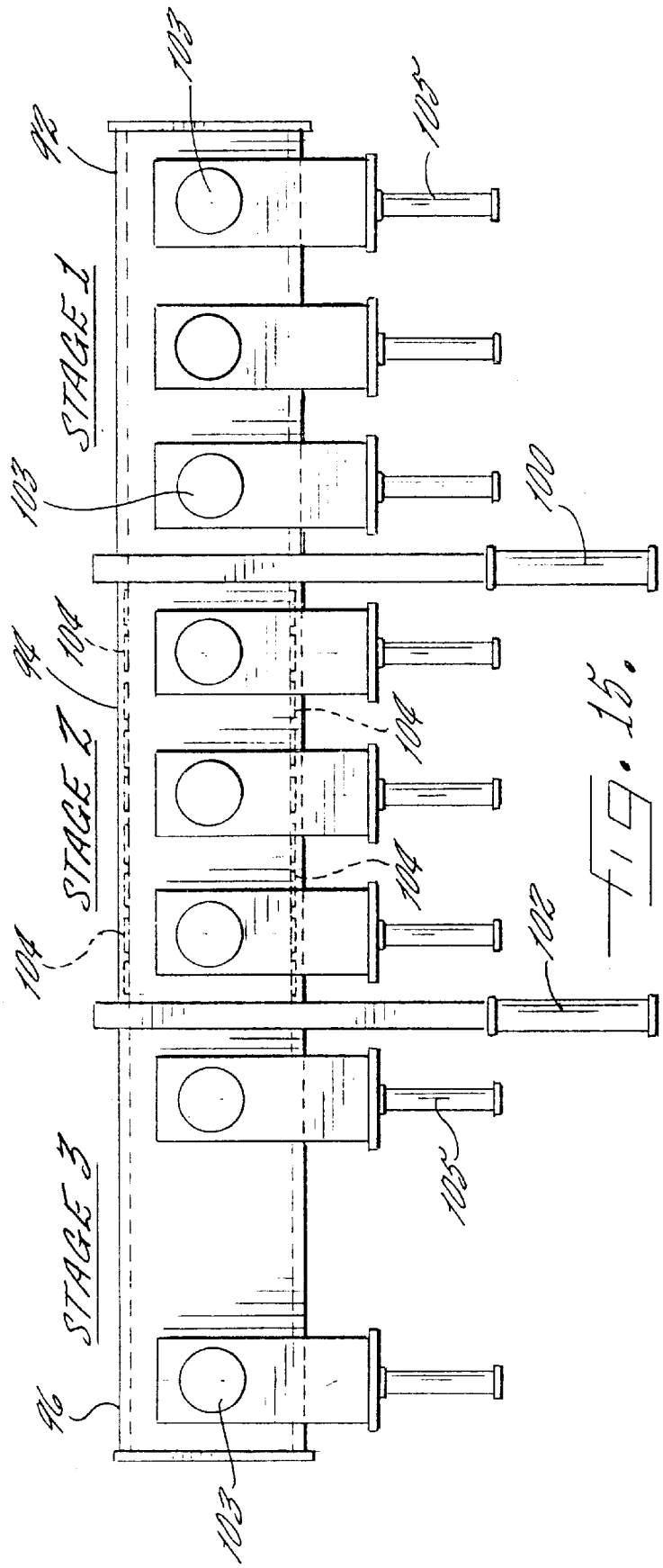
FIG. 15 illustrates a top view of the three vacuum chambers of FIG. 2B, the valves separating the chambers, and pumping means for providing vacuum in the chambers.

The carriage is moved through a series of three consecutive vacuum chambers identified in FIG. 2B as stage 1, stage 2, and stage 3. Stage 1 chamber 92 is used for sputter etching. Stage 2 chamber 94 is used for sputter coating. Stage 3 chamber 96 provides a vacuum lock so that the gears can be transferred successively from one chamber to another without becoming contaminated during coating. Stage 2 can be maintained at a vacuum condition. The chambers are connected by gate or valve mechanisms 100, 102, as illustrated in FIG. 15, that allow each chamber to be isolated from the other and also allow spatial communication between at least two of the chambers for transport of the carriage from one chamber or stage to the next.

Stage 1 and stage 2 are isolated from each other when stage 1 is brought to atmosphere and stage 1 is opened for transport of the carousel into stage 1. The carousel enters stage 1, the stage 1 chamber 92 is closed, and stage 1 is evacuated. The gears or other substrates are then sputter etched in stage 1 in a manner that is believed to be well known to the skilled artisan. Typically, the carousel will be rotated in the manner described below so that the surfaces of the gears are uniformly exposed to the etch.

Separate pumps are provided for each chamber for creating a vacuum condition in each chamber. Roughing pumps (not illustrated) are used to produce an initial vacuum of about $10^{-1}$ torr. Cryogenic pumps 103, as illustrated in FIG. 15, are then used to bring the vacuum in chamber 94 (stage 2) down to about $10^{-7}$ torr to $10^{-6}$ torr. Stage 2 is then backfilled with inert gas to about $10^{-3}$ torr. Two cryogenic pumps typically are used for the third stage and three pumps each are usually used for the first and second stages. There are two large access ports located on the underside of each stage that are available for additional pumps. For example, for enhanced pumping speed, a 100,000 liter/sec Polycold pump is nominally employed during the pump down of the first stage. The cryogenic pumps are isolated from the chambers by gate valves 105.

Stage 2 is at vacuum and is isolated from stages 1 and 3. After the sputter etch is completed, then the gate valve 100 between stages 1 and 2 is opened and the carousel is transported from stage 1 into stage 2. Stage 1 and stage 2 are then isolated from each other and the stage 1 vacuum can be released for receipt of another carousel from atmosphere. Boron carbide coating is sputtered in stage 2 from boron carbide targets 104 that are placed on each side of stage 2 at multiple locations as illustrated in FIG. 15 to provide a uniform distribution of sputtered boron carbide throughout the chamber. After the sputter coating is completed, and stage 3 has been pumped down to vacuum, then the gate 102 between stages 2 and 3 is opened and the carousel is transported from stage 2 to stage 3. Stages 2 and 3 can then be isolated again from each other. Stage 3 can be brought to atmosphere, and stage 3 can be opened to remove the carousel from the coating system.

The carousel, which has been removed from stage 3, and the tracks on which it sits are then moved transversely to the longitudinal axis of the carousel to align the carousel with the track that can return the carousel to the loading and unloading station at the robotic arm.

As previously described, when the carousel loaded with coated parts has arrived at the robotic arm, then the robotic arm can remove the spindled loaded with coated parts and then reload the carousel with uncoated parts for another trip through the system. In this manner, the system operates semi-continuously for large scale production of coated mass produced parts such as transmission gears.

Turning now to a more specific discussion of the carousel as illustrated in FIG. 3, the carousel with spindles loaded thereon is mounted on a wheeled carriage 82. An exploded view of portions of the carousel and carriage is shown in FIG. 5. As shown in FIG. 3, the carousel provides for rotation of the spindles with the gears thereon about the periphery of the carousel. The spindles are also rotated individually about their longitudinal axes so that the gears are rotated with respect to their central axis. Thus, at least two axes of rotation are provided for the gears. This two axis rotation of articles having somewhat complex shapes results in a uniform exposure of the article to the plasma in the sputtering chamber. The rotation of the carousel provides for a uniform coating on the gears so that the coating can be used on substrates having precise tolerances.

The carousel comprises a frame 106 that is mounted on wheeled carriage 82. The wheeled carriage travels along a pair of tracks of circular cross section 86, 88. The wheels 110 on one side of the carriage have a V-groove and serve as guide wheels. The wheels 112 (FIG. 5) on the other side of the track have a flat surface against the track and serve as follower wheels. This arrangement avoids placing tension on the carriage and the wheel axles.

The carriage and carousel are conveyed about the tracks 86, 88 by a rack and pinion gear arrangement. A rack type gear 118 (FIG. 10) runs the length of the frame on the inside of the frame. The rack gear 118 is engaged by a plurality of pinions 120 (FIG. 2B) for moving the carriage forward on tracks 86, 88. As shown in FIG. 2B, the pinions are placed at spaced locations about the track and in the vacuum chambers and engage the rack gear 118 as the previous pinion on the track pushes the carriage forward.

As illustrated in FIG. 5, a pair of chainbelt receiving tracks 114, 116 is mounted on the frame. An endless chainbelt 122 is mounted with one side thereof in this first lower track 114. The opposite side of the chainbelt is mounted in the second upper track 116 for rotation of the chainbelt about the frame. The endless chainbelt comprises a plurality of linkage segments 124 as shown in FIG. 5, each having a pair of parallel linkage bars 126, 128 offset from the linkage bars 130, 132 of the adjacent segment. The linkage bars of each segment are interconnected by linkage pins 134 that extend through apertures in the aligned linkage bars of adjacent segments. A support bearing 136 is mounted on each of the linkage pins between the pairs of linkage bars for engaging a chainwheel 137 for rotation of the chainbelt. The chainwheel is located at one end of the carousel and is mounted on a shaft 138 supported by tapered roller bearings 139 for rotation of the shaft and chainwheel between the first and second chainbelt receiving tracks as shown in FIG. 5. A pair of rollers 140, 141 is mounted on opposite ends of each of the linkage pins for engaging the first and second chainbelt receiving tracks, respectively. An additional roller bearing 142 (FIG. 12) is mounted transverse to rollers 140, 141 and between each pair of rollers 140 for engaging the bottom of track 114. Roller bearing 142 supports the chainbelt in lower track 114 for rotation about track 114. A mounting plate 143 is made an integral part of each pair of linkage bars in a linkage segment for mounting an article holding means, shown generally at 144 (FIG. 11), externally to the chainbelt.

In FIG. 5, a portion of the article holding means includes a housing 145 as illustrated in FIG. 5. As shown in FIG. 13A and in an alternative embodiment of FIG. 13B, a shaft 146 is rotatably secured in the housing. The shaft includes a means for securing the articles such as a recess 148 (FIGS. 13A, 13B) for receiving a spindle loaded with gears. A planet gear 150 (FIGS. 13, 13A, 13B) is mounted on the shaft opposite the end that receives the gear stack on the spindle. The planet gear engages an endless gear 152 (FIG. 10) about the periphery of the frame of the carousel. The planet gear rotates externally about the endless gear in an epicycloidal fashion, which is to say that the planet gear traces a curve generated by the motion of a point on the circumference of the planet gear that rolls externally, without slipping, on the fixed external surface of the carousel frame.

As the planet gear rotates about the endless gear on the frame, the shaft in the housing is rotated about its axis as a shaft rotates about the frame. Accordingly, the gears that are mounted on spindles in the shaft, as explained further below, also rotate about the axis of the spindle as the spindles and gears are rotated about the circumference of the carousel.

Rotation of the chainwheel is accomplished by means of a drive motor 154, which is illustrated in FIG. 12. The drive motor contains a shaft 156 mounted to a male coupler 157 that is inserted between the carriage wheel tracks and up into the engagement of a female coupler 158 that is mounted to the chainwheel shaft 138. A proximity switch or other suitable proximity determining means is placed at each location where it is desired to rotate the carousel. When the carriage is in place and the switch is activated, a hydraulic pump 159 pushes shaft 156 vertically upward between tracks 86, 88 so that male coupler 157 engages female coupler 158. Drive motor 154 can then rotate the coupled shafts 156, 138 to rotate the carousel.

It is desirable for bias sputtering to apply an electrical charge to the gears, as described in U.S. Pat. No. 4,716,083. An electrical lead 160 is shown that provides current to a wire mesh 162 in FIG. 3. With respect to the invention, application of an electrical charge to gear parts that are rotating in two directions at once is accomplished by means of an annular contact 164 illustrated in FIG. 4 that is in electrical contact with the electrically conductive wire mesh 162 that is mounted on the upper portion of the carousel frame above the second chainbelt receiving track. The wire mesh should withstand deformation to 75 or 80 percent so that the contact rings on the shaft do not have to be precisely located to provide electrical contact. The wire mesh is resilient so that when the contact rings press on the mesh during contact, the mesh will spring back for contact with other rings on other article holding means. A copper/beryllium mesh has been used that provides 78 percent deformation and still returns to its original shape. This deformation and resiliency is desirable since temperatures in the sputter deposition process can reach up to 250° F., which results in some thermal expansion. The copper contact rings are insulated from the remainder of the article holding means, which includes the housing, a portion of the shaft, and the planet gear, by means of an insulator 177 having good mechanical and insulation properties, so that current is provided to the gears through the upper portion of the shaft and the spindles, but not to the remainder of the carousel, carriage, and tracks. Additionally, it is preferred to use a grounding cage, which is a wire mesh applied to the top and bottom of the chainbelt receiving tracks, to substantially preclude a floating potential, which could result in plasma traveling into areas that do not contain gears for coating.

It is preferred that the carousel and carriage components typically comprise a stainless steel with a high galling threshold. The steel should be resistant to metal transfer between two contacting surfaces. For example, the linkage pin 134 should be fabricated from such stainless steels as Nitronic 60, Custom 450, UNS 41600 or the like when mated against a material such as 304 stainless steel for linkage bars 124.

Magnetron DC sputtering is preferred for application of a boron carbide sputtered coating to articles such as gears. Hot pressed boron carbide targets 104 are contained on a copper base plate that is mounted to a cathode. When the inert gas is ionized, which generally is argon, but can be any inert gas, the positive ions collide with the boron carbide target, which knocks boron and carbon atoms off the target. The boron and carbon atoms move through the chamber until they either collide with and coat the substrate or hit the walls of the chamber. Because the substrate is electrically biased, positively charged boron and carbon atoms which have been ionized by the background inert argon plasma are guided toward the substrate.

Suitable means should be provided for ensuring that the interior spaces of the carriage are adequately vented at vacuum. For example, FIGS. 6, 7, 8, and 9 illustrate a keyway pin 180 for securing the chainwheel to the drive shaft. The keyway pin is hollow to ensure that the interior space is evacuated. Likewise, the housing of the article holding means should include apertures 182 (FIG. 13) for venting the housing interior space.

It should be recognized that other vacuum coatings can be applied by the apparatus, system, and method of the invention as described herein. Boron carbide was selected as illustrative of one embodiment for applying a desirable coating to gears in an efficient manner by coating multiple gears in a semi-continuous fashion. The invention is also useful for application of a wide variety of other materials by vacuum coating, including those materials that are applied in a sputtering atmosphere that incorporates reactive components. For example, copending U.S. patent application Ser. No. 08/552,500, which was filed on Nov. 9, 1995, the contents of which are incorporated fully herein by reference, describes a disordered coating that has cubic boron nitride dispersed therein wherein nitrogen is incorporated as a reactive gas into an inert gas sputtering atmosphere. The nitrogen reacts with boron sputtered from a boron carbide target to form cubic boron nitride. The invention described in the instant application is fully applicable to reactive gas sputtering methods.

It should also be apparent to the skilled artisan that the invention as described, including the carriage, carousel, and the modes of conveyance and rotation of the carriage and carousel can be programmed for computer control. Such computer control would include parameters for coating with the particular coating of choice. System architecture and software for computer controlled operation of the invention as described hereinabove is believed to be within the purview of the skilled artisan. The vacuum stages could also be stacked to provide multiple coaters in parallel for service by one robotic arm, if desired, for even more efficient operation.

The foregoing description is to be considered illustrative rather than restrictive of the invention. While this invention has been described in relation to its specific embodiments, it is to be understood that various modifications thereof will be apparent to those of ordinary skill in the art upon reading the specification and it is intended to cover all such modifications that come within the meaning and range of equivalents of the appended claims.

What is claimed is:

1. A system for vacuum coating of articles comprising:
   a) first, second, and third vacuum chambers located in series and separated by valves wherein the first chamber is for cleaning the articles, the second is for coating the articles, and the third is for removing the articles from vacuum without contaminating the second chamber;
   b) means for separately evacuating and pressurizing each of said three chambers; and
   c) means for moving the articles successively through each said chamber, said means comprising
      i) carousel means for rotating the articles in an epicycloidal fashion at least in said coating chamber, said carousel means further comprising:
         1) a frame;
         2) an endless gear mounted externally of said frame;
         3) an endless chainbelt mounted for rotation about said frame;
         4) means for rotating said chainbelt about said frame; and
         5) a plurality of means mounted on said chainbelt for holding the articles, each said means including:
            a housing; a shaft rotatably secured in said housing, said shaft including means for securing the articles, and a planet gear mounted on said shaft and engaging said endless gear on said frame, said planet gear rotating externally about said endless gear in an epicycloidal fashion as said chainbelt rotates, whereby said shaft is rotated axially as said shaft rotates about said frame; and
      ii) means for transporting the carousel means successively through said chambers.

2. The system of claim 1 wherein said transport means comprises a pair of tracks in each of said three chambers and a driven pinion for engaging said carousel means and for urging said carousel means through said successive vacuum chambers, and wherein said carousel means is mounted on wheels for engaging said tracks and comprises a rack for engaging said pinion for transport through said chambers.

3. The system of claim 1 further comprising means for loading articles onto and unloading articles from said carousel means and for returning said carousel means having articles loaded thereon to said three chambers.

4. The system of claim 3 wherein said means for loading articles onto and unloading articles from said carousel means includes means for precise and reproducible positioning of articles on said carousel means.

5. The system of claim 3 further comprising means for precise and reproducible positioning of articles removed from said carousel means onto a receiving pallet.

6. The system of claim 1 wherein said system is for sputter coating articles in a vacuum chamber, said first chamber is for sputter etching said articles and said second chamber is for sputtering a coating onto said articles, and said first, second, and third chambers are cooperatively operated for maintaining vacuum in said second chamber, and wherein said system includes means for cleaning said articles prior to entry of said articles into said first chamber for sputter etching.

7. The system of claim 1 wherein said system is for sputter coating articles with boron carbide coating and said second chamber further comprises boron carbide targets for supplying the boron carbide for sputtering.

8. The system of claim 1 wherein said system is for sputter coating annular gears with boron carbide and said gears are mounted in stacks on spindles adapted for mounting on said carousel means.

9. The system of claim 1 wherein said system is for sputter coating gears, taps, drill bits, core pins, broaches and combinations of such articles and wherein said carousel means includes a plurality of means for holding the articles.

10. A system for sputter coating articles comprising:
    a) first, second, and third vacuum chambers located in series and separated by valves wherein the first chamber is for sputter etching the articles, the second is for sputter coating the articles, and the third is for removing the articles from vacuum without contaminating the second chamber;
    b) means for separately evacuating and pressurizing each of said three chambers;
    c) means for moving the articles successively through each said chamber, said means comprising
       i) carousel means for rotating the articles in an epicycloidal fashion at least in said coating chamber; and
       ii) means for transporting the carousel means successively through said chambers; and
    d) means for cleaning said articles prior to entry of said articles into said first chamber for sputter etching, said cleaning means including:

i) a vapor honer for vapor honing the articles;

ii) operator means for placing articles in an array for aqueous cleaning;

iii) a plurality of alternating aqueous cleaning baths and rust inhibitor baths for cleaning the articles;

iv) a dryer for drying the articles;

v) a carriage for transporting the dried articles to said carousel means for sputter coating; and vi) operator means for loading said carriage with articles.

11. The system of claim 10 further comprising a) a robotic arm means for loading articles from said carriage onto said carousel means and for unloading coated articles from said carousel means, and a heater means for removing residual moisture from said articles prior to entry into said first chamber; wherein said carousel means returns from said third chamber to said robotic arm means loaded with coated articles for unloading and reloading with uncoated articles.

12. A system for vacuum coating of articles comprising:

a) first, second, and third vacuum chambers located in series and separated by valves, wherein the first chamber is for cleaning the articles, the second chamber is for coating the articles and comprises material for vacuum coating placed at multiple locations in said second chamber, and the third chamber is for removing the articles from vacuum without contaminating the second chamber;

b) means for separately evacuating and pressurizing each of the three chambers; and c) means for moving the articles successively through each said chamber, said means for moving comprising:

i) carousel means for rotating the articles in an epicycloidal fashion at least in said coating chamber, said carousel means adapted for transport successively through each of said first, second, and third chambers and having a frame about which said articles are rotated, said frame extending longitudinally in the direction of movement of said carousel successively through each chamber; and ii) means for semi-continuously transporting said carousel means successively through said chambers.

13. The system of claim 12 wherein said transport means comprises a pair of tracks in each of said three chambers and a driven pinion for engaging said carousel means and for urging said carousel means through said successive vacuum chambers, and wherein said carousel means is mounted on wheels for engaging said tracks and comprises a rack for engaging said pinion for transport through said chambers.

14. The system of claim 12 wherein said carousel means further comprises:

a) an endless gear mounted externally of said frame;

b) an endless chainbelt mounted for rotation about said frame;

c) means for rotating said chainbelt about said frame; and d) a plurality of means mounted on said chainbelt for holding the articles, each said means including:
a housing,
a shaft rotatably secured in said housing, said shaft including means for securing the articles, and
a planet gear mounted on said shaft and engaging said endless gear on said frame, said planet gear rotating externally about said endless gear in an epicycloidal fashion as said chainbelt rotates, whereby said shaft is rotated axially as said shaft rotates about said frame.

15. The system of claim 12 further comprising means for loading articles onto and unloading articles from said carousel means and for returning said carousel means having articles loaded thereon to said three chambers.

16. The system of claim 15 wherein said means for loading articles onto and unloading articles from said carousel means includes means for precise and reproducible positioning of articles on said carousel means.

17. The system of claim 15 further comprising means for precise and reproducible positioning of articles removed from said carousel means onto a receiving pallet.

18. The system of claim 12 wherein said system is for sputter coating articles in a vacuum chamber, said first chamber is for sputter etching said articles and said second chamber is for sputtering a coating onto said articles, and said first, second, and third chambers are cooperatively operated for maintaining vacuum in said second chamber, and wherein said system includes means for cleaning said articles prior to entry of said articles into said first chamber for sputter etching.

19. The system of claim 17 wherein said cleaning means includes:

a) a vapor honer for vapor honing the articles;

b) operator means for placing articles in an array for aqueous cleaning;

c) a plurality of alternating aqueous cleaning baths and rust inhibitor baths for cleaning the articles;

d) a dryer for drying the articles;

e) a carriage for transporting the dried articles to said carousel means for sputter coating; and f) operator means for loading said carriage with articles.

20. The system of claim 12 further comprising a heater means for removing residual moisture from said articles prior to entry into said first chamber.

21. The system of claim 12 wherein said system is for sputter coating articles with boron carbide coating and said vacuum coating material comprises boron carbide targets for supplying the boron carbide for sputtering.

22. The system of claim 12 wherein said system is for sputter coating annular gears with boron carbide and said gears are mounted in stacks on spindles adapted for mounting on said carousel means.

23. The system of claim 12 wherein said system is for sputter coating gears, taps, drill bits, core pins, broaches and combinations of such articles and wherein said carousel means includes a plurality of means for holding the articles.

24. The system of claim 16 wherein said means for precise and reproducible positioning of articles comprises a robotic arm means.

25. The system of claim 17 wherein said means for precise and reproducible positioning of articles comprises a robotic arm means.

* * * * *